(12) United States Patent
Sakurada

(10) Patent No.: US 9,029,199 B2
(45) Date of Patent: May 12, 2015

(54) METHOD FOR MANUFACTURING SEMICONDUCTOR DEVICE

(71) Applicant: Elpida Memory, Inc., Tokyo (JP)

(72) Inventor: Shinichi Sakurada, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 6 days.

(21) Appl. No.: 13/924,093

(22) Filed: Jun. 21, 2013

(65) Prior Publication Data

US 2013/0344658 A1    Dec. 26, 2013

(30) Foreign Application Priority Data

Jun. 22, 2012   (JP) .................................. 2012-140835

(51) Int. Cl.
| | |
|---|---|
| *H01L 21/00* | (2006.01) |
| *H01L 21/44* | (2006.01) |
| *H01L 21/78* | (2006.01) |
| *H01L 23/00* | (2006.01) |
| *H01L 23/02* | (2006.01) |

(Continued)

(52) U.S. Cl.
CPC ................ *H01L 21/78* (2013.01); *H01L 24/97* (2013.01); *H01L 2224/0401* (2013.01); *H01L 2224/0557* (2013.01); *H01L 2224/06181* (2013.01); *H01L 2224/13009* (2013.01); *H01L 2224/14181* (2013.01); *H01L 2224/16145* (2013.01); *H01L 2224/16225* (2013.01); *H01L 2224/32145* (2013.01); *H01L 2224/32225* (2013.01); *H01L 2224/48227* (2013.01); *H01L 2224/73204* (2013.01); *H01L 2224/73207* (2013.01); *H01L 2224/73265* (2013.01); *H01L 2224/92125* (2013.01); *H01L 2224/94* (2013.01); *H01L 2224/97* (2013.01); *H01L 2924/15311* (2013.01); *H01L 2924/18161* (2013.01); *H01L 2224/11009* (2013.01); *H01L 2224/11002* (2013.01); *H01L 2924/07802* (2013.01)

(58) Field of Classification Search
CPC .................................. H01I 24/97; H01I 21/78
USPC .......... 438/108, 109, 113, 613; 257/686, 777, 257/E21.599, E25.013, E23.021
See application file for complete search history.

(56) References Cited

U.S. PATENT DOCUMENTS

| | | | | | |
|---|---|---|---|---|---|
| 5,863,813 | A | * | 1/1999 | Dando | .......................... 438/114 |
| 5,989,982 | A | * | 11/1999 | Yoshikazu | .................... 438/462 |

(Continued)

FOREIGN PATENT DOCUMENTS

| | | |
|---|---|---|
| JP | 8-321478 A | 12/1996 |
| JP | 2004-207607 A | 7/2004 |

(Continued)

*Primary Examiner* — Mary Wilczewski
*Assistant Examiner* — Erik T Peterson

(57) ABSTRACT

A method for manufacturing a semiconductor device includes: preparing a semiconductor wafer including a plurality of semiconductor chips arranged in the shape of a matrix, the semiconductor wafer having a first bump electrode formed on one face thereof; forming a depressed portion on a first face of the semiconductor wafer, the depressed portion partitioning the semiconductor wafer into respective semiconductor chips; placing the first face of the semiconductor wafer onto a support tape; and cutting the semiconductor wafer along the depressed portion from a second face opposite to the first face of the semiconductor wafer by the use of a dicing blade having a width smaller than the width of the depressed portion to thereby divide the semiconductor wafer into a plurality of semiconductor chips.

8 Claims, 8 Drawing Sheets

(51) Int. Cl.
*H01L 23/48* (2006.01)
*H01L 23/52* (2006.01)
*H01L 29/40* (2006.01)

(56) References Cited

U.S. PATENT DOCUMENTS

| | | | | |
|---|---|---|---|---|
| 6,107,164 | A * | 8/2000 | Ohuchi | 438/465 |
| 6,534,387 | B1 * | 3/2003 | Shinogi et al. | 438/465 |
| 6,908,784 | B1 * | 6/2005 | Farnworth et al. | 438/106 |
| 6,964,915 | B2 * | 11/2005 | Farnworth et al. | 438/460 |
| 7,514,291 | B2 * | 4/2009 | Akram | 438/110 |
| 2002/0192867 | A1 * | 12/2002 | Nishiyama | 438/110 |
| 2003/0001281 | A1 * | 1/2003 | Kwon et al. | 257/777 |
| 2004/0026768 | A1 * | 2/2004 | Taar et al. | 257/686 |
| 2004/0113283 | A1 * | 6/2004 | Farnworth et al. | 257/782 |
| 2004/0241907 | A1 * | 12/2004 | Higashino et al. | 438/109 |
| 2004/0245652 | A1 * | 12/2004 | Ogata | 257/777 |
| 2005/0051882 | A1 * | 3/2005 | Kwon et al. | 257/678 |
| 2005/0202651 | A1 * | 9/2005 | Akram | 438/463 |
| 2006/0175697 | A1 * | 8/2006 | Kurosawa et al. | 257/686 |
| 2006/0244149 | A1 * | 11/2006 | Nakamura et al. | 257/773 |
| 2007/0090535 | A1 * | 4/2007 | Kiendl et al. | 257/777 |
| 2007/0158809 | A1 * | 7/2007 | Chow et al. | 257/686 |
| 2009/0189258 | A1 * | 7/2009 | Mariani et al. | 257/632 |
| 2010/0258931 | A1 * | 10/2010 | Yoshida et al. | 257/686 |
| 2010/0258932 | A1 * | 10/2010 | Yoshida et al. | 257/686 |
| 2010/0261311 | A1 * | 10/2010 | Tsuji | 438/109 |
| 2011/0057327 | A1 * | 3/2011 | Yoshida et al. | 257/777 |
| 2012/0049354 | A1 * | 3/2012 | Sawayama et al. | 257/737 |
| 2012/0098145 | A1 * | 4/2012 | Yoshida et al. | 257/774 |
| 2013/0344658 | A1 * | 12/2013 | Sakurada | 438/113 |

FOREIGN PATENT DOCUMENTS

| | | |
|---|---|---|
| JP | 2007-157974 A | 6/2007 |
| JP | 2010-251347 A | 11/2010 |

* cited by examiner

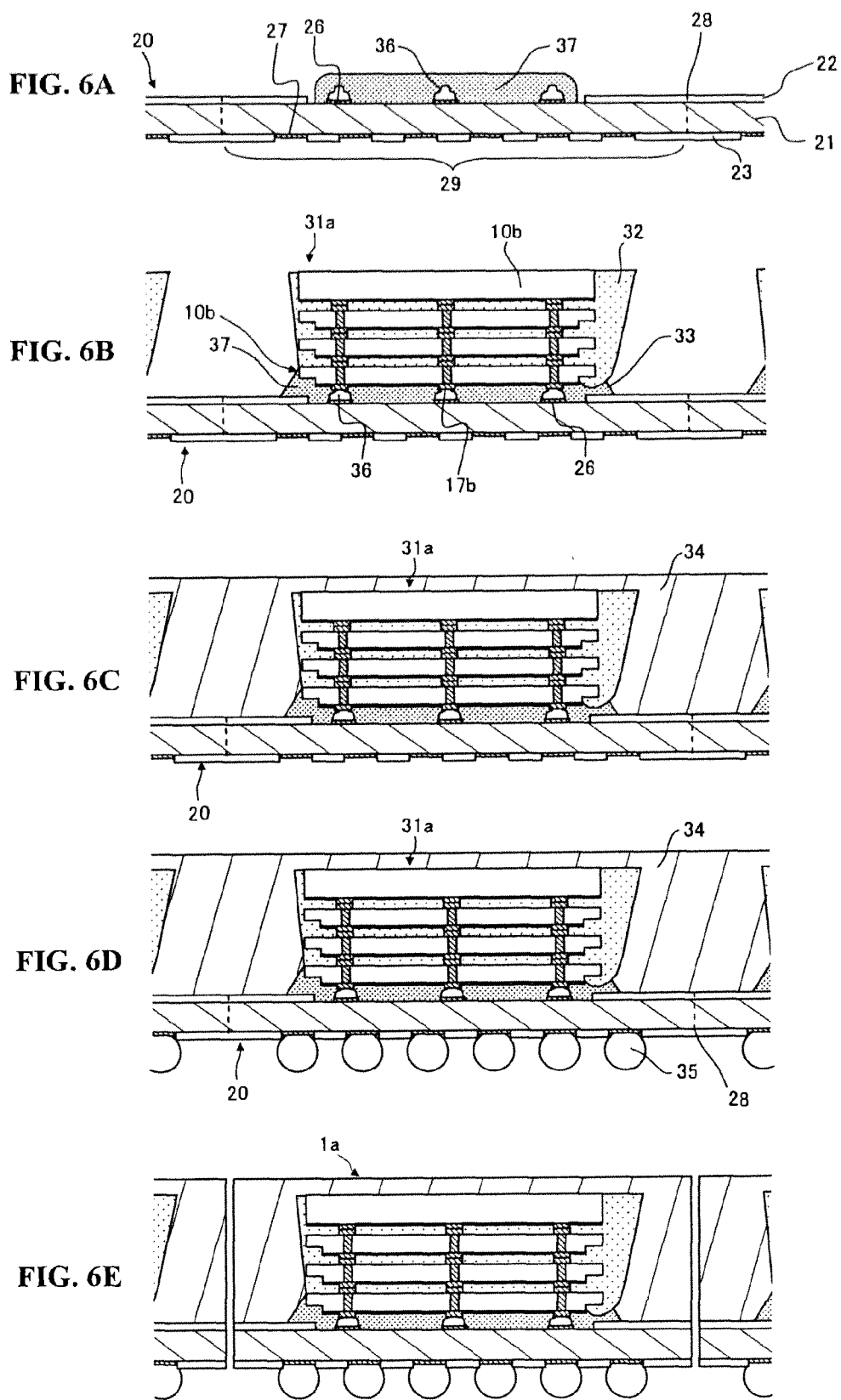

METHOD FOR MANUFACTURING SEMICONDUCTOR DEVICE

This application is based upon and claims the benefit of priority from Japanese patent application No. 2012-140835, filed on Jun. 22, 2012, the disclosure of which is incorporated herein in its entirety by reference.

BACKGROUND OF THE INVENTION

1. Field of the Invention

The present invention relates to a method for acquiring a plurality of semiconductor devices from a semiconductor wafer, that is, for manufacturing a semiconductor device.

2. Description of Related Art

To meet the needs of downsized electronic device featuring increased functionally, a semiconductor device called a chip on chip (CoC) in which a plurality of semiconductor chips are laminated on each other has been developed in recent years. Japanese Patent Application Laid-Open No. 2010-251347 (hereinafter referred to as patent document 1) discloses a method for manufacturing a CoC type semiconductor device. The method includes the steps of: laminating a plurality of semiconductor chips on each other; filling an underfill in the clearances between the semiconductor chips disposed next to each other to thereby form a chip laminated body; and mounting the chip laminated body on a wiring board. The semiconductor chip is formed by dividing a semiconductor wafer having a circuit and the like formed thereon into individual chip regions.

Japanese Patent Application Laid-Open No. 8-321478 (hereinafter referred to as patent document 2) discloses a method for manufacturing a semiconductor device. The method includes a step of cutting a bonded body, which is made by bonding a semiconductor substrate having a plurality of semiconductor device patterns formed thereon repeatedly to an insulating substrate, along cutting regions to thereby separate the bonded body into individual semiconductor devices. In this method, before the semiconductor substrate is bonded to the insulating substrate, first cuttings (half cuttings) are formed in regions corresponding to the cutting regions of the insulating substrate. Then, after the semiconductor substrate is bonded to the insulating substrate, the bonded body is separated into individual semiconductor devices by second cuttings (full-cuttings).

Japanese Patent Application Laid-Open No. 2007-157974 (hereinafter referred to as patent document 3) discloses a method for manufacturing a resin sealing material in which a single body of a semiconductor chip is sealed. In this method, first, a plurality of semiconductor chips are arranged at intervals in the shape of a lattice and then the plurality of semiconductor chips are sealed by resin, whereby a resin sealing material is formed in which the plurality of semiconductor chips are sealed. Half cuttings are formed on one face of the resin sealing material in a longitudinal direction and in a lateral direction in such a way that the semiconductor chips are individually divided. Thereafter, the resin sealing material is fully cut by a dicing blade from a face (bottom face) having an external electrode formed thereon along the groove-shaped lines of the half-cuttings. In this way, the resin sealing material in which the single bodies of the semiconductor chips are sealed is individually divided into the single bodies of the semiconductor chips.

In the CoC type semiconductor device described in the patent document 1, the semiconductor chip that makes up the chip laminated body has bump electrodes formed on both faces thereof. These bump electrodes are connected to other semiconductor chip and/or a wiring board. The semiconductor chip is manufactured by cutting and separating a semiconductor wafer including a plurality of semiconductor chips into individual chip regions. When the semiconductor wafer is cut, usually, one face of the semiconductor wafer is made to adhere to and to be held by a dicing tape.

The semiconductor wafer including the plurality of semiconductor chips having the bump electrodes formed on both faces thereof needs to be placed onto the dicing tape in such a way that the bump electrodes are embedded in the adhesive material layer of the dicing tape. For this reason, the adhesive material layer needs to be made comparatively thick.

However, in the case where the thickness of the adhesive material layer of the dicing tape is made thick, cutting the semiconductor wafer with a dicing blade that rotates at a high speed, easily causes chipping (cracking) to occur in the bottom face of the semiconductor wafer (semiconductor chip). This is because the side faces of the dicing blade rotating at the high speed come into contact with an edge of the bottom face (face on which the dicing tape is placed) of the cut semiconductor chip. When the edge of the semiconductor chip is chipped off, the strength and reliability of the semiconductor chip are likely to be reduced. Further, in the case where the bump electrodes are arranged near the periphery of the semiconductor chip, the bump electrodes can be also damaged in some cases by the chipping of the semiconductor chip.

The patent document 2 and the patent document 3 do not disclose the problem in which chipping is caused by the bottom face of the semiconductor chip interfering with the dicing blade at the time of dicing because of the dicing tape having the thin adhesive material layer in which the bump electrodes need to be embedded.

SUMMARY

A method for manufacturing a semiconductor device in one embodiment includes: preparing a semiconductor wafer including a plurality of semiconductor chips arranged in the shape of a matrix, the semiconductor wafer having a first bump electrode formed on a first face thereof; forming a depressed portion on the first face of the semiconductor wafer, the depressed portion partitioning the semiconductor wafer into respective semiconductor chips; placing the first face of the semiconductor wafer onto a support tape; and cutting the semiconductor wafer along the depressed portion from a second face opposite to the first face of the semiconductor wafer by using a dicing blade having a width smaller than a width of the depressed portion to thereby divide the semiconductor wafer into the plurality of semiconductor chips.

A semiconductor device in one embodiment has a first semiconductor chip having a bump electrode formed thereon, a second semiconductor chip arranged opposite to the first semiconductor chip, and sealing material. The second semiconductor chip has a first bump electrode formed on a second face opposite to the first semiconductor chip, a second bump electrode formed on a first face facing the first semiconductor chip and electrically connected to the bump electrode of the first semiconductor chip, and a depressed portion formed along one side of the second face. The sealing material is formed over a portion that extends from the clearances between the first semiconductor chip and the second semiconductor chip to at least a part of the depressed portion.

In the construction described above, the semiconductor wafer is fully cut toward the depressed portion formed previously on the semiconductor wafer, so that when the semiconductor wafer is fully cut, the dicing blade does not come into contact with an edge of one face (face placed onto the support tape) of the semiconductor chip. Hence, the occurrence of chipping of the semiconductor chip can be prevented. As a result, the strength and reliability of the semiconductor chip can be improved.

BRIEF DESCRIPTION OF THE DRAWINGS

The above features and advantages of the present invention will be more apparent from the following description of certain preferred embodiments taken in conjunction with the accompanying drawings, in which:

FIGS. 6A to 6E are process charts to show one example of a method for mounting the composite chip laminated body on a wiring board;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
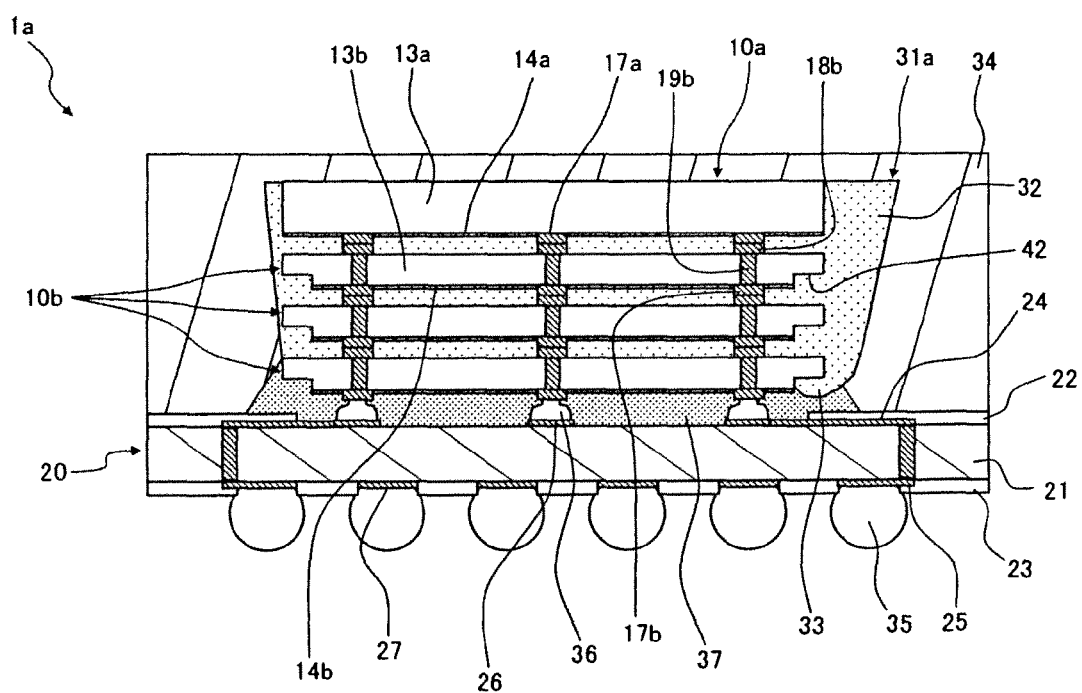
FIG. 1 is a schematic section view of a CoC type semiconductor device in a first exemplary embodiment of the present invention.
Figure 2A:
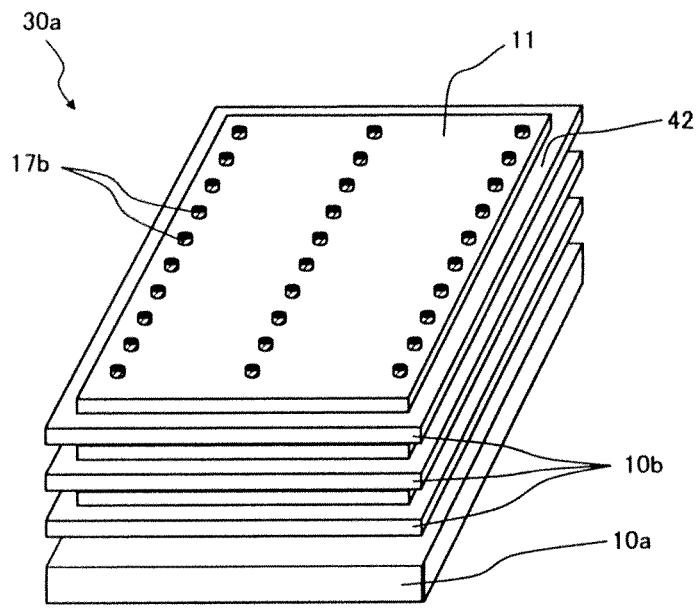
FIG. 2A is a schematic perspective view of a chip laminated body in which semiconductor chips are laminated on each other.
Figure 2B:
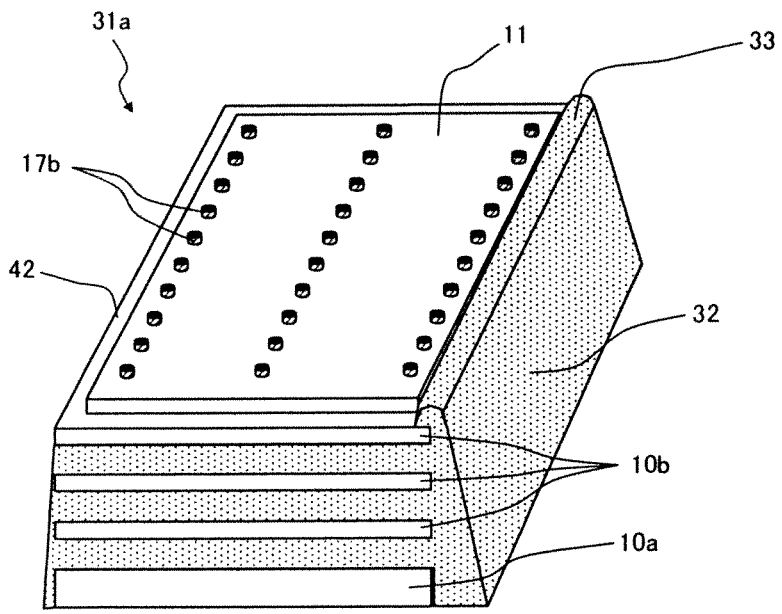
FIG. 2B is a schematic perspective view of a composite chip laminated body made of the chip laminated body and a sealing resin.

FIG. 1 is a schematic section view of a CoC type semiconductor device in a first exemplary embodiment of the present invention. A semiconductor device 1a has a wiring board 20 and a chip laminated body in which a plurality of semiconductor chips 10a, 10b are laminated on each other. FIG. 2A shows a chip laminated body 30a disposed in the semiconductor device 1a. FIG. 2B shows a composite chip laminated body 31a made of the chip laminated body 30a and a first sealing material (sealing resin) 32. Here, the chip laminated body 30a and the composite chip laminated body 31a shown in FIG. 2A and FIG. 2B are drawn in a manner turned upside down with respect to the state shown in FIG. 1.

In the present specification, a chip laminated body having the first sealing material 32 formed therein is referred to as "a composite chip laminated body". Thus, "the composite chip laminated body" is differentiated on from "the chip laminated body" in some cases. However, this differentiation is made for the sake of convenience and it should be understood that "the composite chip laminated body" is also a kind of "the chip laminated body".

The wiring board 20 may be a glass epoxy wiring board having a thickness of, for example, 0.14 mm. The glass epoxy wiring board has a glass epoxy substrate 21, wiring patterns 24, 25 formed on both faces of the glass epoxy substrate 21, and insulating films 22, 23, for example, solder resists for partially covering the wiring patterns 24, 25. The wiring board 20 has openings formed in the central region of the insulating film 22 on one surface thereof. Parts of the wiring pattern 24 are exposed from the openings of the insulating film 22 and form a plurality of connection pads 26. Further, parts of the wiring pattern 25 are exposed from the insulating film 23 on the other face of the wiring board 20. The parts of the wiring pattern 25 exposed from the insulating film 23 form a plurality of lands 27. The connection pads 26 and the lands 27 that correspond to the connection pads 26 are electrically connected to each other by the wiring patterns 24, 25. On each of the lands 27 is formed a metal ball 35, for example, a solder ball which is to be an external terminal.

The chip laminated body 30a or the composite chip laminated body 31a is mounted on the wiring board 20. In the present exemplary embodiment, the chip laminated body 30a, as shown in FIG. 2A, includes four semiconductor chips 10a, 10b laminated on each other. Each of the semiconductor chips 10a, 10b may be, for example, a memory chip. In the present exemplary embodiment, one of the four semiconductor chips is referred to as a first semiconductor chip 10a and three of the four semiconductor chips are referred to as second semiconductor chips 10b. However, differentiating the names of the first semiconductor chip 10a and the second semiconductor chip 10b is made only for the sake of convenience.

The first semiconductor chip 10a has a semiconductor substrate 13a and a circuit 14a. For example, the semiconductor substrate 13a is made of silicon. For example, the circuit 14a is a memory circuit formed on one face of the semiconductor substrate 13a. On the semiconductor substrate 13a are formed a plurality of electrode pads (not shown) electrically connected to the circuit 14a. On one face, except for the electrode pads, of the semiconductor substrate 13a may be formed a passivation film (not shown) made of, for example, polyimide. Bump electrodes 17a are respectively formed on electrode pads. Here, the first semiconductor chip 10a does not have a through electrode and hence can be made thicker than the thickness of the second semiconductor chip 10b. For example, the thickness of the first semiconductor chip 10a may be about 100 μm.

The second semiconductor chip 10b has a semiconductor substrate 13b and a circuit 14b. For example, the semiconductor substrate 13b is made of silicon. For example, the circuit 14b is a memory circuit formed on one face of the semiconductor substrate 13b. The circuit 14b formed on the second semiconductor chip 10b may be the same as the circuit 14a formed on the first semiconductor chip 10a.

Figure 4A:
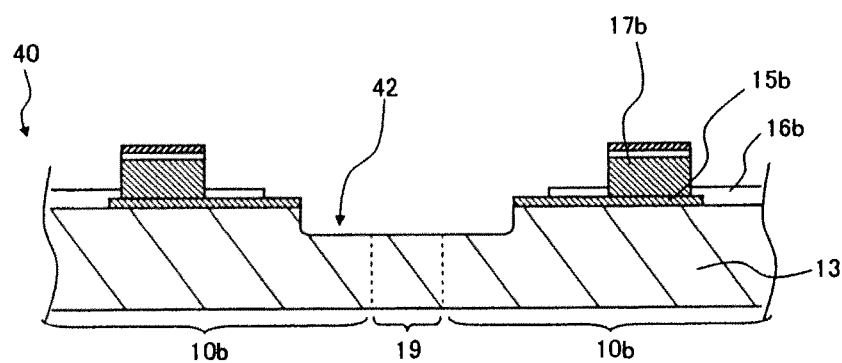
FIGS. 4A to 4C are enlarged views of a dicing region between semiconductor chips, which show several steps of the method shown in FIGS. 3A to 3F.
Figure 4B:
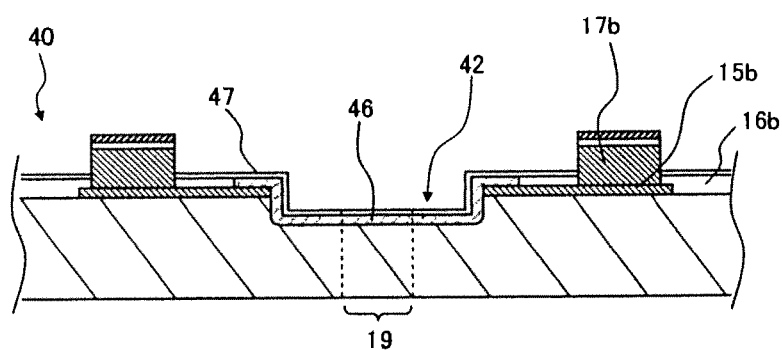

A plurality of electrode pads 15b that are electrically connected to the circuit 14b are formed on the semiconductor substrate 13b (see also FIG. 4B). An insulating passivation film 16b covers one face of the semiconductor substrate 15b except for the electrode pads 15b. For example, the insulating passivation film 16b is made of polyimide. First bump electrodes 17b are formed on the respective electrode pads 15b.

The second semiconductor chip 10b has a plurality of second bump electrodes 18b formed on one face opposite to the one face having the first bump electrodes 17b formed thereon. The second bump electrodes 18b are electrically connected to the first bump electrodes 17b corresponding thereto by through wirings 19b passed through the semiconductor substrate 13b, respectively.

As shown in FIGS. 1, 2A and 2B, the second semiconductor chip 10b has a depressed portion (stepped portion) 42 formed on an end side of the one face thereof, on which the first bump electrodes 17b are formed. The depressed portion 42 may have, for example, a width of 20 μm and a depth of 20 μm. It is preferable that the depressed portion 42 be formed on at least one side of the one face of the second semiconductor chip 10b, and it is more preferable that the depressed portion 42 be formed on all peripheral sides of the one face of the second semiconductor chip 10b. The three second semiconductor chips 10b may have the same construction.

Here, in the present exemplary embodiment, the first semiconductor chip 10a does not have the depressed portion 42 formed thereon. However, the first semiconductor chip 10a does not have the same depressed portion as the depressed portion 42 that was formed on the second semiconductor chip 10b.

The second bump electrodes 18b of one of the second semiconductor chips 10b are electrically connected to the first bump electrodes 17a of the first semiconductor chip 10a. The second bump electrodes 18b of the other two second semiconductor chips 10b are electrically connected to the first bump electrodes 17b of the other second semiconductor chips 10b. For reasons that have to do with the manufacturing process of the through wirings 19b, it is preferable that second semiconductor chip 10b be thinner than the first semiconductor chip 10a. For example, the second semiconductor chip 10b may have a thickness of 50 μm.

A clearance between the first semiconductor chip 10a and the second semiconductor chip 10b and clearances between the second semiconductor chips 10b disposed next to each other are filled with a first sealing material 32, for example, an underfill material. Since the depressed portion (stepped portion) 42 is formed on the second semiconductor chip 10b, an advantage is produced in which adhesion of the second semiconductor chip 10b to the first sealing material 32 is improvement.

A non-conductive paste (NCP) 37 may be disposed between the wiring board 20 and the composite chip laminated body 31a. The adhesion of the NCP 37 to the second semiconductor chip 10b can be improved by the depressed portion 42 of the second semiconductor chip 10b on the uppermost stage of the chip laminated body 31a.

When the underfill material as the first sealing material 32 is supplied, a portion 33 of the underfill material 32 climbs up the depressed portion 42 formed on the second semiconductor chip 10b in the uppermost stage in some cases. In this case, the depressed portion 42 prevents the spread of a top portion 33 of the underfill material 32. Hence, even in the case where the underfill material 32 climbs up the second semiconductor chip 10b, the depressed portion 42 can prevent the underfill material 32 from covering the first bump electrodes 17b formed on the one face of the second semiconductor chip 10b.

Further, the top portion 33 of the underfill material 32 is arranged on the depressed portion 42 of the second semiconductor chip 10b, so that the height of the portion, that protrudes from a surface 11 of the second semiconductor chip 10b in the top portion 33 of the underfill material 32, can be reduced. As a result, the height of the composite chip laminated body 31a can be reduced.

The first bump electrodes 17b formed on the one face of the second semiconductor chip 10b on the uppermost stage of the chip laminated body 30a are electrically connected to the corresponding connection pads 26 formed on the one face of the wiring board 20. The first bump electrodes 17b formed on the one face of the second semiconductor chip 10b on the uppermost stage may be electrically connected to the connection pads 26 via wire bumps (stud bumps) 36 made of Au or the like.

As described above, the top portion 33 of the first sealing material 32 is arranged on the depressed portion 42 formed on the end side of the second semiconductor chip 10b on the uppermost stage of the chip laminated body 30a, so that the height of the top portion 33 that protrudes from the chip laminated body 30a can be suppressed. This can prevent the interference between the top portion 33 of the first sealing material 32 and the insulating film 22 of the wiring board 20. As a result, the composite chip laminated body 31a can be successfully mounted on the wiring board 20.

It is preferable that the wire bump 36 be formed in a convex shape tapered to the chip laminated body 30a. In this way, width (diameter) of the first bump electrodes 17b and the through wirings 19b, which are formed on the second semiconductor chip 10b on the uppermost stage of the chip laminated body 30a, can be made small. In the case where the first bump electrodes 17b and the through wirings 19b have a small diameter, the diameter of through holes for forming the through wirings 19b in the semiconductor substrate 13b of the second semiconductor chip 10b can be made small. As a result, the pitch of the bump electrodes 17b can be made narrower and/or the occurrence of the cracks of the semiconductor chip 10b, which start from the through electrode 19b, can be prevented.

As described above, it is preferable that the thickness of the first semiconductor chip 10a be larger than the thickness of the second semiconductor chip 10b. When the first semiconductor chip 10a is arranged at the farthest position from the wiring board 20, the first semiconductor chip 10a can resist stress produced by the expansion and contraction of the through electrode 19b caused by a temperature change in a manufacturing process. As a result, the chip cracks of the second semiconductor chip 10b can be prevented.

Next, a method for manufacturing the second semiconductor chip 10b used in the chip laminated body 30a will be described. FIGS. 3A to 3F show the respective steps of a method for forming the second semiconductor chip 10b.

Figure 3A:
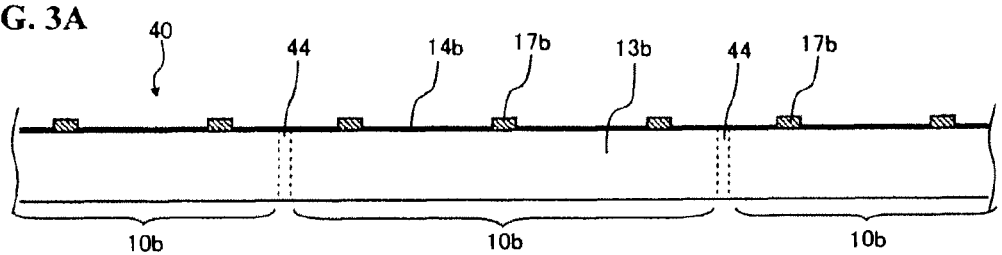
FIGS. 3A to 3F are process charts to show one example of a method for manufacturing a semiconductor chip.

First, as shown in FIG. 3A, a semiconductor wafer 40 is prepared. The semiconductor wafer 40 includes a plurality of chip regions (semiconductor chips) 10b arranged in the shape of a matrix. The semiconductor wafer 40 has a semiconductor substrate 13b made of, for example, silicon. The semiconductor wafer 40 is partitioned into the plurality of chip regions (semiconductor chips) 10b partitioned by dicing regions 44. The semiconductor chips 10b of the semiconductor wafer 40 have a circuit 14b, for example, a memory circuit and an electrode pad 15b on one face of semiconductor chips 10b (see also FIG. 4A). A protection film (passivation film) 16b, for example, a polyimide film is formed on the one face of the semiconductor chip 10b. The passivation film 16b has an opening formed therein. The electrode pad 15b is exposed from the opening. The electrode pad 15b that is exposed from the opening forms the first bump electrode 17b. The first bump electrode 17b may be constructed of, for example, a post portion made of Cu, a Ni plated layer formed on the surface of the post portion, and Au plated layer for preventing oxidation. The Ni plated layer is formed to prevent a diffusion of Cu atoms of the post portion.

Figure 3B:
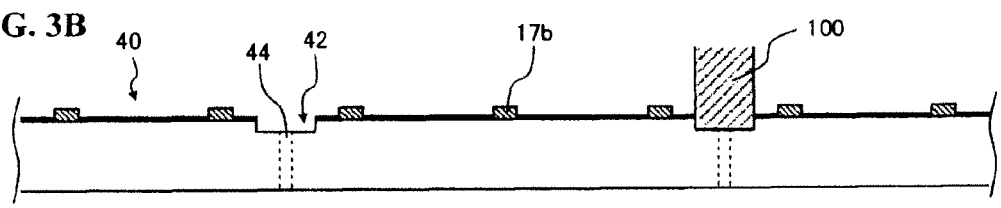

Next, the one face of the semiconductor wafer 40, on which the first bump electrodes 17b are formed, is half-cut by a dicing blade 100 of a dicing device, whereby the depressed portion 42 is formed in the dicing region of the semiconductor wafer 40 (see FIG. 3B and FIG. 4A). For example, the dicing blade 100 may have a blade width of 35 µm. The depth of the depressed portion 42 may be about 20 µm. The depressed portions 42 are formed along all the dicing regions 44 on the one face of the semiconductor wafer 40.

As shown in FIG. 4B, a power supplying wiring layer 46 and an insulating film 47 for covering the power supplying wiring layer 46 are formed, as required, on the bottom of the depressed portion 42 that is formed in the semiconductor wafer 40. The power supplying wiring layer 46 is used when the through wiring 19b and the second bump electrode 18b are formed.

Figure 3C:
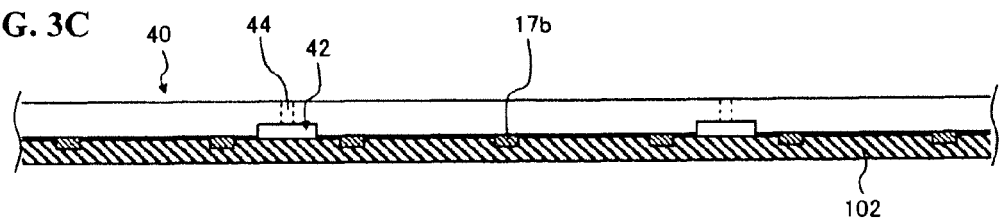

Next, a support tape 102, for example, a background (BG) tape is placed on the one face of the semiconductor wafer 40 on which the first bump electrodes 17b are formed (see FIG. 3C). It is preferable that an adhesion layer of the support tape 102 have a thickness in which the first bump electrodes 17b can be embedded. Then, by grinding the bottom face of the semiconductor wafer 40, that is, a face having the support tape 102 not placed thereon, by means of a wafer BG device, the semiconductor wafer 40 is thinned to a desired thickness, for example, about 50 µm.

Figure 3D:
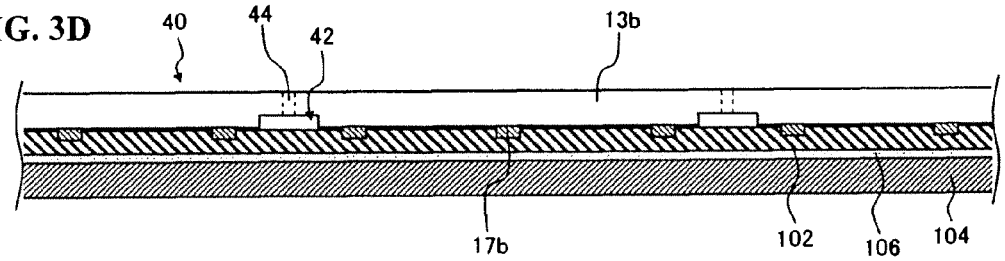
Figure 3E:
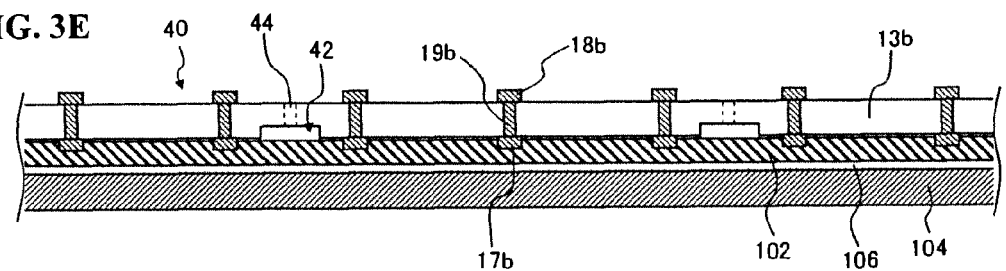
Figure 3F:
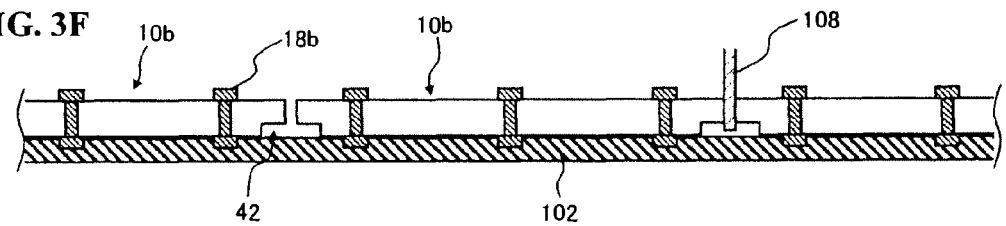

Next, the semiconductor wafer 40 is mounted on wafer support substrate 104 in the state where the support tape 102 is placed onto the semiconductor wafer 40 (see FIG. 3D). If the support tape 102 is left placed onto the semiconductor wafer 40, when the semiconductor wafer 40 is mounted on the wafer support substrate 104, the support tape 102 can prevent the adhesion layer 106 from entering the depressed portion 42.

Figure 4C:
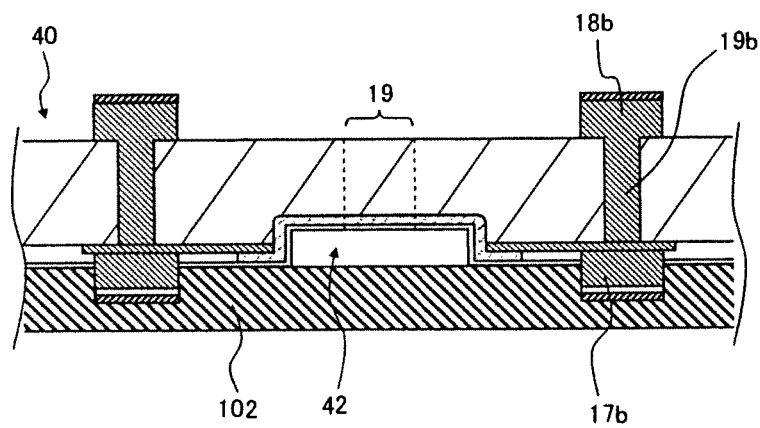

Next, the thinned semiconductor wafer 40 has the through wirings 19b and the second bump electrodes 18b formed thereon. The through wirings 19b and the second bump electrodes 18b are formed at positions that correspond to the first bump electrodes 17b. First, through holes are formed in a face, on which the first bump electrodes 17b are not formed, of the semiconductor substrate 13b. The through holes can be formed by etching. By electrically plating the insides of the through holes by using the power supplying wirings, the through electrodes 19b are filled in the through holes and the second bump electrodes 18b are formed (see FIG. 3E and FIG. 4C). The second bump electrode 18b may be constructed of a post portion and a soldered layer formed on the post portion so as to bond the bump. For example, the post portion is made of Cu. For example, the soldered layer is made of a SnAg plated layer.

Next, the semiconductor wafer 40 is full-cut from the one face on which the second bump electrodes 18b are formed along the dicing line by the dicing blade 108. The dicing blade 108 has a narrower width than the width of the dicing blade 100 used for half-cutting. The dicing blade 108 may have a width of, for example, 15 to 20 µm. The semiconductor wafer 40 is divided into the semiconductor chips 10b by the full-cutting performed by the dicing blade 108. Thereafter, the second semiconductor chips 10b are picked up from the support tape 102, whereby the second semiconductor chips 10b having the depressed portion (stepped portion) 42 that is formed on four sides of the one face can be acquired.

Since the semiconductor wafer 40 is full-cut toward the depressed portion 42 that was formed previously, the dicing blade 108 is not put into contact with the edges of the one face (face on which the first bump electrodes 17b are formed) of the second semiconductor chip 10b. Hence, the chipping of the second semiconductor chip 10b can be reduced. As a result, strength and reliability of the second semiconductor chip 10b can be improved.

Here, in FIGS. 3A to 3F and FIGS. 4A to 4C, the method for manufacturing the second semiconductor chip 10b having the through wirings 19b has been described. However, the abovementioned method for cutting the semiconductor wafer 40 to thereby divide the semiconductor wafer 40 into the individual semiconductor chips can be applied also to the manufacture of a semiconductor chip not having the through wiring 19b. In this case, the process of manufacturing the through wiring 19b and the like is not required.

FIGS. 5A to 5E show a method for manufacturing the chip laminated body 30a in which the semiconductor chips 10a, 10b are laminated on each other, and a method for manufacturing the composite chip laminated body 31a having the chip laminated body 30a and the first sealing material 32.

In the case where the chip laminated body 30a is manufactured, first, a plurality of semiconductor chips are prepared. In the present exemplary embodiment, the first semiconductor chip 10a and the second semiconductor chip 10b are prepared. The semiconductors 10a, 10b have plate-shaped semiconductor substrates 13a, 13b and desired circuit 14a, 14b. The semiconductor substrates 13a, 13b are formed nearly in a square shape and are made of silicon or the like. The circuit 14a, 14b are formed on one faces of the semiconductor substrates 13a, 13b, respectively.

The first semiconductor chip 10a is placed on a bonding stage 114 with the one face having the circuit 14a that is provided thereon facing up. The bonding stage 114 sucks and holds the first semiconductor chip 10a by a suction hole 116.

Next, the second semiconductor chip 10b is mounted on the first semiconductor chip 10a, and the bump electrodes 17a that are formed on the one face of the first semiconductor chip 10a are bonded to the second bump electrodes 18b of the second semiconductor chip 10b. In this way, the second semiconductor chip 10b is connected and fixed to the first semiconductor chip 10a.

A thermocompression bonding method for applying a load to the semiconductor chips 10a, 10b by using bonding tool 110 set at a high temperature can be used to bond the bump electrodes 17a, 18b. The bonding tool 110 has a suction hole 112 for sucking and holding the semiconductor chip 10b. Instead of the thermocompression bonding method, a ultrasonic compression bonding method for applying a ultrasonic wave and for bonding or a ultrasonic thermocompression method that uses the thermocompression and the ultrasonic compression can be also used to bond the semiconductor chips 10a, 10b.

A third-stage second semiconductor chip 10b is connected and fixed to the second semiconductor chip (second-stage second semiconductor chip) 10b by the same method. A fourth-stage second semiconductor chip 10b is connected and fixed to the third-stage second semiconductor chip 10b by the same method (see FIG. 5B). In this way, the chip laminated body 30a shown in FIG. 5C can be acquired.

The chip laminated body 30a is placed on, for example, a coating sheet 121 placed on a stage 120. It is preferable that the coating sheet 121 be a material having a bad wettability to the first sealing material (underfill material) 32, for example, a fluorine-based sheet or a sheet coated with a silicone-based adhesive. In this regard, the coating sheet 121 does not need to be placed directly onto the stage 120 but can be placed on any face, if the face is a flat face. The coating sheet 121 may be placed onto, for example, a jig or the like placed on the stage 120.

Figure 5A:
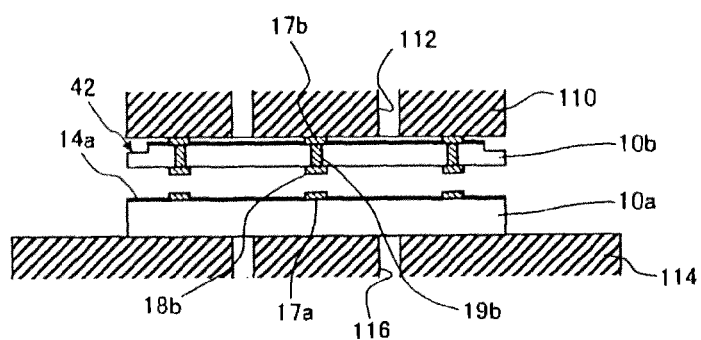
FIGS. 5A to 5E are process charts to show one example of a method for manufacturing a composite chip laminated body including a sealing resin and a chip laminated body in which semiconductor chips are laminated on each other.
Figure 5B:
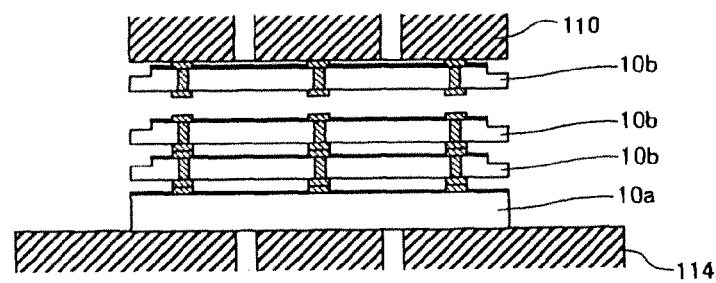
Figure 5C:
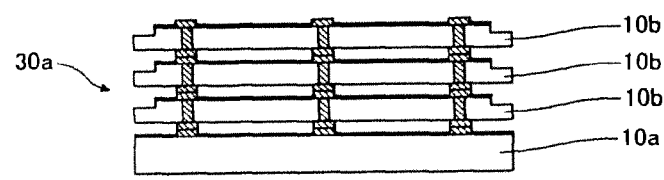
Figure 5D:
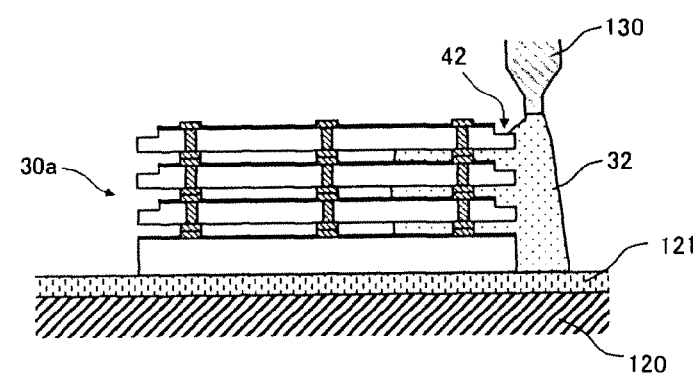

Next, the first sealing material (underfill material) 32 is supplied by using dispenser 130 from near one end portion of the chip laminated body 30a placed on the coating sheet 121 (see FIG. 5D). The first sealing material 32 supplied by the dispenser 130 has fluidity. The first sealing material 32 forms a fillet around the chip laminated body 30a and enters the clearances between the semiconductor chips 10a, 10b by a capillary phenomenon and fills the clearances between the semiconductor chips 10a, 10b.

Further, when the first sealing material 32 is supplied, the portion 33 of the first sealing material 32 climbs up the depressed portion 42 formed on the second semiconductor chip 10b on the uppermost stage in some cases. In this case, the depressed portion 42 can prevent the top portion 33 of the first sealing material 32 from spreading. Still further, the top portion 33 of the first sealing material 32 is arranged on the depressed portion 42 of the second semiconductor chip 10b, so that a portion, which protrudes from the surface of the second semiconductor chip 10b, of the top portion 33 of the first sealing material 32 can be reduced in height.

In the case where the coating sheet 121 is made of a material having bad wettability to the first sealing material 32, the coating sheet 121 can prevent the first sealing material 32 from spreading and can hence reduce the fillet width. Here, when the first sealing material 32 is supplied to the chip laminated body 30a, in order to prevent the chip laminated body 30a from being shifted in position, the chip laminated body 30a may be temporarily fixed to the coating sheet 121 by the use of a resin adhesive.

Figure 5E:
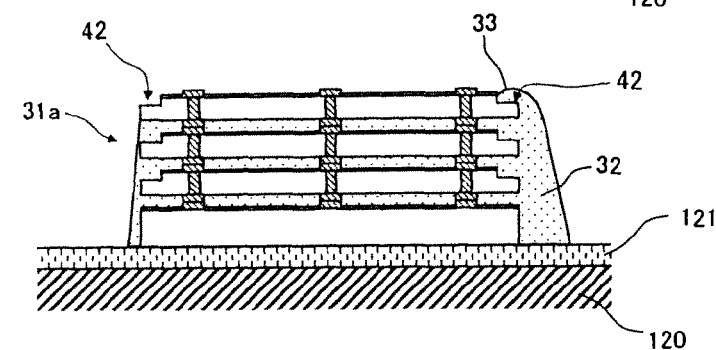

After the first sealing material 32 is supplied, the first sealing material 32 is cured (heat-treated) at a desired temperature, for example, about 150° C. in the state where the semiconductor chip 10a, 10b are placed on the coating sheet 121. In this way, the first sealing material 32 is thermally hardened. As a result, the first sealing material 32 that covers the periphery of the chip laminated body 30a and fills the clearances between the semiconductor chips 10a, 10b is formed. In this way, the composite laminated body 31a that is shown in FIG. 5E is acquired.

After the first sealing material 32 is thermally hardened, the composite laminated body 31a is picked up from the coating sheet 121. In the case where the coating sheet 121 is made of a material having bad wettability to the first sealing material 32, the composite laminated body 31a can be easily picked up from the coating sheet 121.

Next, an example of a method for mounting the composite laminated body 31a on the wiring board 20 will be described. First, the wiring board 20 having a plurality of product forming pairs 29 that are arranged in the shape of a matrix is prepared (see FIG. 6A). Each of the product forming parts 20 is a part that becomes the wiring board 20 of a semiconductor device (see FIG. 1). Each of the product forming parts 29 has desired wiring patterns 24, 25. Parts of the wiring patterns 24, 25 form the connection pads 26 and the lands 27. The wiring patterns 24, 25 are covered with insulating films 22, 23 such as solder resist films except for the parts of the connecting pads 26 or the lands 27. The respective product forming parts 29 are partitioned by dicing lines 28 that cut off the wiring boards 20 individually.

A plurality of connection pads 26 are formed on one face of the wiring board 20. The connection pads 26 are electrically connected to the composite chip laminated body 31a. A plurality of lands 27 are formed on the other face of the wiring board 20. Each lands 27 is connected to a metal ball 35 which will become an external terminal. The connection pads 26 are electrically connected to the lands 27 by the wiring patterns 24, 25 (see also FIG. 1). The wire bump 36 is formed on each connection pads.

Next, an insulating adhesive material 37, for example, NCP is applied to the respective product forming parts of the wiring board 20. Then, the composite chip laminated body 31a is mounted on the product forming parts 20 of the wiring board 20 (see FIG. 6B). At this time, the first bump electrodes 17b of the second semiconductor chip 10b on the uppermost stage of the composite chip laminated body 31a are bonded to the wire bumps 36 on the connection pads 26 of the wiring board 20, for example, by the thermocompression method. The adhesive material 37 that is applied to the wiring board 20 is filled in the clearance between the composite chip laminated body 31a and the wiring board 20, whereby the wiring board 20 and the composite chip laminated body 31a are bonded and fixed to each other.

The top portion 33 of the first sealing material 32 is arranged on the depressed portion 42 that is formed on the end side of the second semiconductor chip 10b, so that when the composite chip laminated body 31a is mounted on the wiring board 20, the interference between the top portion 33 of the first sealing material 32 and the insulating film 22 of the wiring board 20 can be prevented.

The wiring board 20 mounted with the composite chip laminated body 31a is set in a molding die of a transfer mold device (not shown), and the manufacturing process is shifted to a mold process. The molding die has a cavity (not shown) for covering the composite chip laminated body 31a in the lump, and the composite chip laminated body 31a that is mounted on the wiring board 20 is received in the cavity.

Next, a sealing resin (second sealing material) 34, which is heated and fused, is poured into the cavity of the molding die and the second sealing material 34 is filled in the cavity in such a way as to cover the whole of the composite chip laminated body 31a. The second sealing material 34 can be made of a thermosetting resin, for example, an epoxy resin (see FIG. 6C).

Subsequently, the second sealing material 34 is cured at a desired temperature, for example, 180° C. in the state where the cavity is filled with the second sealing material 34, whereby the second sealing material 34 is thermally hardened. Further, the second sealing material 34 is baked at a desired temperature, thereby being completely hardened.

In the present exemplary embodiment, the clearances between the semiconductor chips are sealed by the first sealing material 32 and then the second sealing material 34 for covering the whole of the composite chip laminated body 31a is formed. Hence, this can prevent a void from being produced between the semiconductor chips.

Next, the manufacturing process is shifted to a ball mounting process. The conductive metal balls 35, for example, solder balls, which become the external terminals of the semi-conductor device, are connected to the lands 27 that are formed on the wiring board 20 (see FIG. 6D). In the ball mounting process, a plurality of metal balls 35 are sucked and held by a mounting tool having a plurality of suction holes which are identical in position to the respective lands 27 of the wiring board 20 and after flux is transferred to the respective metal balls 35, the respective held metal balls 35 are mounted on the lands 27 of the wiring board 20 in the lump. After the mounting of the metal balls 35 on all of the product forming parts 29 is completed, the wiring board 20 is reflowed, whereby the respective metal balls 35 are connected to the respective lands 27.

Next, the manufacturing process is shifted to a substrate dicing process. The respective product forming parts 29 are cut off and separated from each other along dicing lines 28 (see FIG. 6E). In this way, a plurality of semiconductor devices 1a can be formed.

In the substrate dicing process, a dicing tape may be placed on the second sealing material 34, and the product forming parts 29 may be held by the dicing tape. Then, the wiring board 20 and the second sealing material 34 are cut along the dicing lines 28 by using the dicing blade (not shown). After cutting, the respective semiconductor devices 1a are picked up from the dicing tape.

While the invention made by the present inventor has been described up to this point on the basis of the exemplary embodiment, the present invention is not limited to the exemplary embodiment described above but, of course, can be variously modified within a scope not departing from the gist of the present invention.

Figure 7:
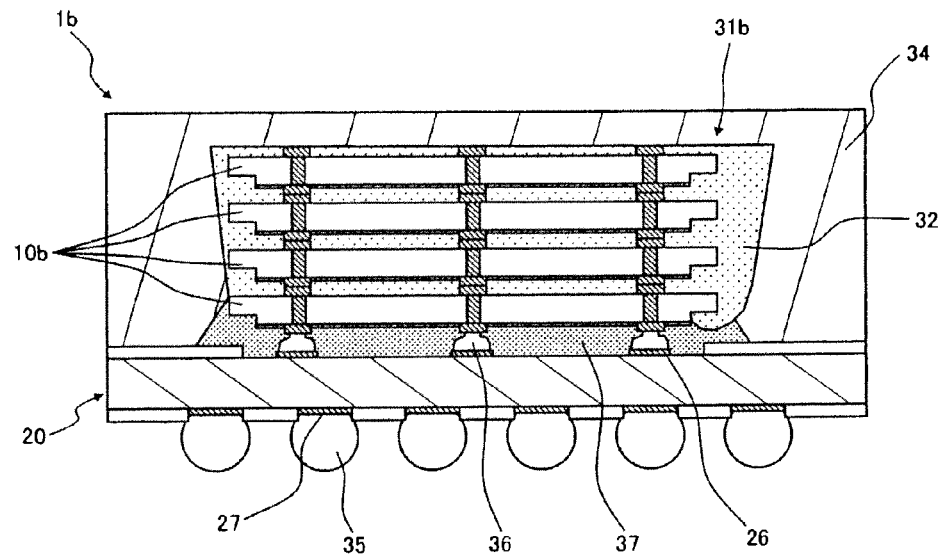
FIG. 7 is a schematic section view of a CoC type semiconductor device in a second exemplary embodiment of the present invention.

In the exemplary embodiment shown in FIG. 1 and FIG. 2, the first semiconductor chip 10a at the lowermost stage of the composite chip laminated body 31a is a thick chip not having the through electrode and the second bump electrode. However, in a semiconductor device 1b of a second exemplary embodiment shown in FIG. 7, the second semiconductor chip 10b is used in place of the first semiconductor chip 10a. That is, all of the semiconductor chips of a composite chip laminated body 31b are the second semiconductor chips 10b. Each of these second semiconductor chips 10b has the depressed portion (stepped portion) 42 formed on at least one end side, preferably, all end sides of the face thereof.

Here, the other constructions of the semiconductor device 1b that are the same as those of the semiconductor device 1a and that are the same constructions as those the semiconductor device 1a shown in FIG. 1 are denoted by the same reference symbols.

Figure 8:
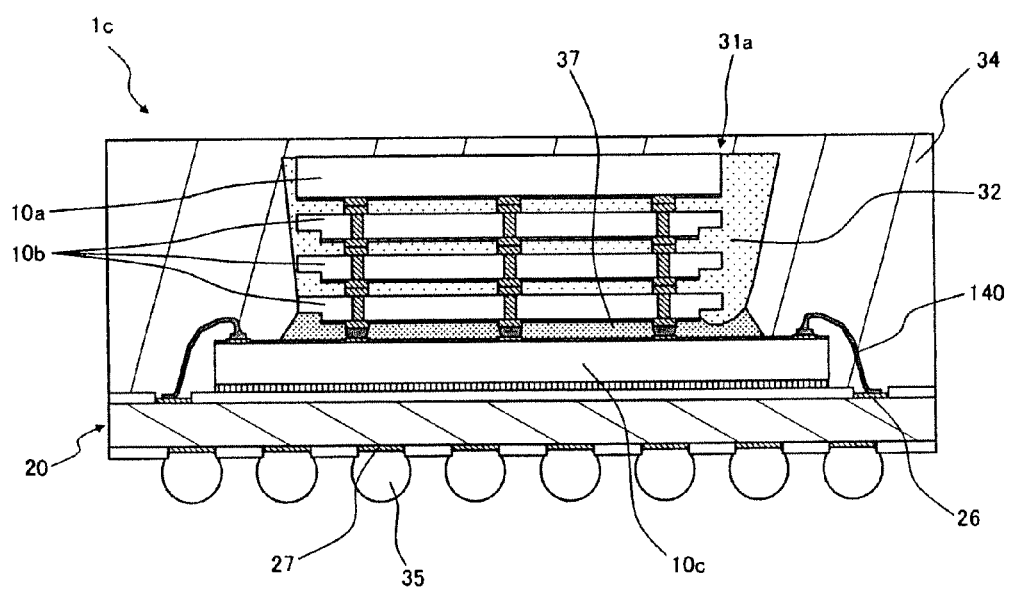
FIG. 8 is a schematic section view of a CoC type semiconductor device in a third exemplary embodiment of the present invention.

In the exemplary embodiments shown in FIG. 1 and FIG. 2, the composite chip laminated body 31a is mounted on the wiring board 20. However, in a semiconductor device 1c of a third exemplary embodiment shown in FIG. 8, the composite chip laminated body 31a is mounted on another third semiconductor chip 10c, for example, a logic chip. In this way, the semiconductor device 1c including the composite chip laminated body 31a can be highly efficiency.

In the third exemplary embodiment, the third semiconductor chip 10c is electrically connected to the connection pads of the wiring substrate 20 by the conductive wires 140.

Here, the other constructions of the semiconductor device 1c that are the same as those of the semiconductor device 1a shown in FIG. 1 and that are the same construction as those of the semiconductor 1a shown in FIG. 1 are denoted by the same reference symbols.

Figure 9:
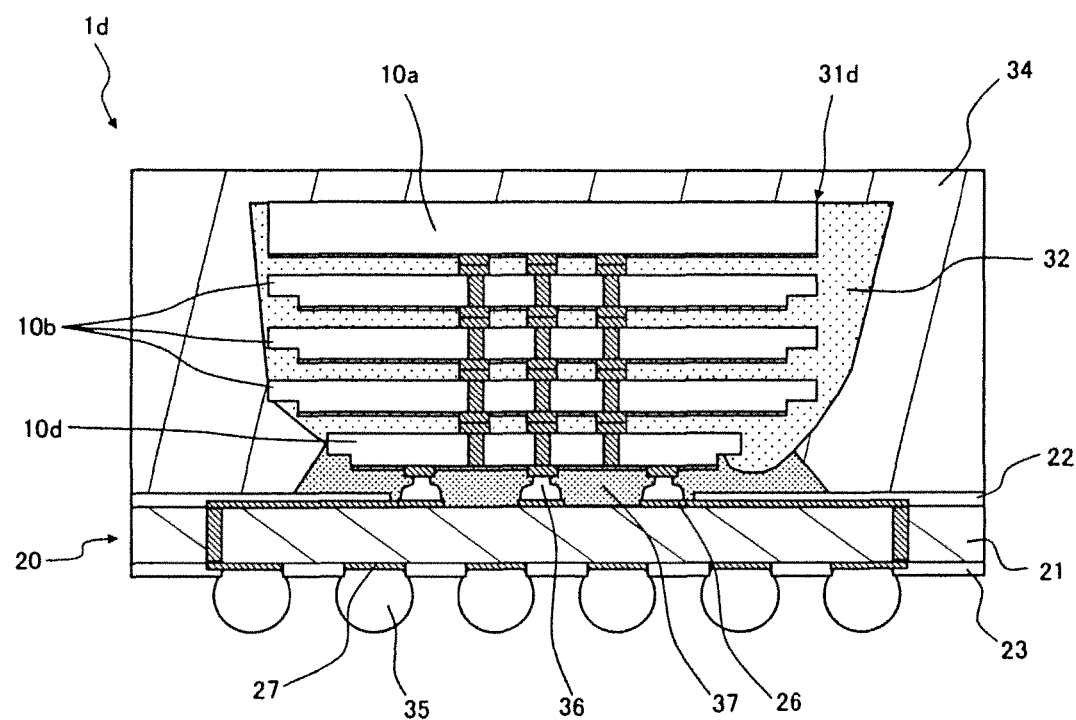
FIG. 9 is a schematic section view of a CoC type semiconductor device in a fourth exemplary embodiment of the present invention.

In the exemplary embodiments shown in FIG. 1 and FIG. 2, the composite chip laminated body 31a includes one first semiconductor chip 10a and three second semiconductor chips 10b. However, in a semiconductor device 1d of a fourth exemplary embodiment shown in FIG. 9, a composite chip laminated body 31d includes five semiconductor chips 10a, 10b, 10d. The first semiconductor chip 10a and the second semiconductor chip 10b may be memory chips, as explained in the first exemplary embodiment. The third semiconductor chip 10d may be an interface chip for controlling the memory chips.

Here, the other constructions of the semiconductor device 1d that are the same as those of the first semiconductor chip 1a shown in FIG. 1, and that are the same constructions as those of the semiconductor device 1a shown in FIG. 1 are denoted by the same reference symbols.

As described above, the number and the kind of the semiconductor chip that are included in the composite chip laminated body can be appropriately selected according to usage and function. In short, the circuits that are formed in the respective semiconductor chips may be different from each other. Further, the plurality of semiconductor chips may be different in size from each other.

Although the inventions has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A method, comprising:
   preparing a semiconductor wafer including an upper surface, a lower surface opposite to the upper surface, a plurality of semiconductor chips formed on a side of the upper surface and a plurality of depressed portions defining the semiconductor chips;
   providing a supporting member on the upper surface of the semiconductor wafer so that the depressed portions are apart from the supporting member;
   cutting the semiconductor wafer from a side of the lower surface along the depressed portions to divide the semiconductor wafer into the semiconductor chips;
   forming a plurality of first bump electrodes on the side of the upper surface of the semiconductor wafer, the first bump electrodes being arranged to each of the semiconductor chips;
   forming a plurality of second bump electrodes on the lower surface of the semiconductor wafer, each of the second bump electrodes being electrically coupled to a corresponding one of the first bump electrodes by a through wiring;
   forming a plurality of power supplying wirings on the depressed portions of the semiconductor wafer,
   wherein the second bump electrodes are formed by an electric plating method using the power supplying wirings.

2. The method as claimed in claim 1, wherein each of the depressed portions has a first width,
   the semiconductor wafer is cut from the side of the lower surface along the depressed portions by a dicing blade, and the dicing blade has a second width that is smaller than the first width.

3. The method as claimed in claim 2, wherein the first width is approximately 35 μm, and the second width is approximately 25 μm less than the first width.

4. The method as claimed in claim 1, further comprising:
   picking up the semiconductor chips from the supporting member, after cutting the semiconductor wafer;
   stacking the semiconductor chips with each other to form a stacked structure; and
   filling gaps between the semiconductor chips of the stacked structure with a sealing resin, each of the depressed portions of the semiconductor chips being filled with the sealing resin.

5. A method for manufacturing a semiconductor device having stacking semiconductor chips, the method comprising:
   preparing a semiconductor wafer including an upper surface, a lower surface opposite to the upper surface, a plurality of semiconductor chips formed on a side of the upper surface and a plurality of depressed portions defining the semiconductor chips;
   forming a first bump electrode on a first face of a first one of the plurality of semiconductor chips;

forming a second bump electrode on a first face of a second one of the plurality of semiconductor chips and a circuit layer on a second face thereof opposite to the first face, a first one of the plurality of depressed portions being formed along the circumference of the second face of the second semiconductor chip;

bonding the second bump electrode of the second semiconductor chip to the first bump electrode of the first semiconductor chip so that the first and the second semiconductor chips form a stacking structure;

providing a sealing material into a clearance between the first semiconductor chip and the second semiconductor chip; and forming a first power supplying wiring on the plurality of depressed portions of the semiconductor wafer which define the semiconductor chips, wherein the second bump electrode is formed by an electric plating method using the first power supplying wiring.

6. The method of claim 5, further comprising:

forming a third bump electrode on the circuit layer of the second semiconductor chip, the third bump electrode being aligned with the second bump electrode in a direction perpendicular to the second face; and forming a second through wiring in the second semiconductor chip, the second through wiring passing through the second semiconductor chip and being electrically connected to the second and the third bump electrodes.

7. The method of claim 6, further comprising:

preparing a third semiconductor chip, the third semiconductor chip having a fourth bump electrode disposed on a first face thereof and a circuit layer on a second face thereof opposite to the first face, a second one of the plurality of depressed portions being formed along the circumference of the second face of the third semiconductor chip; and bonding the fourth bump electrode of the third semiconductor chip to the third bump electrode of the second semiconductor chip so that the first, the second and the third semiconductor chips form a stacking structure.

8. The method of claim 5, wherein a thickness of the first semiconductor chip is greater than a thickness of the second semiconductor chip.

* * * * *